United States Patent

Banak et al.

[11] Patent Number: 5,298,817
[45] Date of Patent: Mar. 29, 1994

[54] HIGH-FREQUENCY SOLID-STATE RELAY

[75] Inventors: Michael A. Banak, Oak Lawn, Ill.; Andrew P. Sabol, Oley Township, Berks County, Pa.

[73] Assignee: AT&T Bell Laboratories, Murray Hill, N.J.

[21] Appl. No.: 15,482

[22] Filed: Feb. 9, 1993

[51] Int. Cl.$^5$ .................................. H03K 17/04
[52] U.S. Cl. .................... 307/580; 307/311; 307/574; 307/584
[58] Field of Search .............. 307/249, 572, 574, 575, 307/576, 577, 579, 581, 584, 585, 633, 311, 255, 319, 254, 550, 580

[56] References Cited

U.S. PATENT DOCUMENTS

| | | | |
|---|---|---|---|
| 4,438,356 | 3/1984 | Fleischer | 307/584 |
| 4,864,126 | 9/1989 | Walters et al. | 307/311 |
| 4,875,023 | 10/1989 | Maoz | 307/550 |
| 4,902,901 | 2/1990 | Pernyeszi | 307/311 |
| 5,013,926 | 5/1991 | Aizawa | 307/311 |
| 5,138,177 | 8/1992 | Morgan et al. | 307/311 |

OTHER PUBLICATIONS

Preliminary Technical Data dated Jun. 1989, Hewlett Packard, for the HSSR-7230/1 Solid State Relay.
Product Selection Guide, 1992, "Analog Multiplexers (MUX)", Harris Semiconductor.

Primary Examiner—John S. Heyman
Assistant Examiner—Shawn Riley

[57] ABSTRACT

An electronic solid-state relay having pass transistors and a shunt transistor. The pass transistors are connected between input terminals and connected together at a common node. The shunt transistor is connected between the common node and ground or, if the relay is a differential relay, to a common node connected to pass transistors connected to another set of input terminals. The transistors are controlled by a common control signal, with the change in conductivity of the pass transistors being the inverse of the change in conductivity of the shunt transistor in response to the control signal.

5 Claims, 2 Drawing Sheets

HIGH-FREQUENCY SOLID-STATE RELAY

BACKGROUND OF THE INVENTION

1. Field of the Invention

This invention relates to relays generally and, more particularly, to solid-state relays which can switch high-frequency signals.

2. Description of the Prior Art

Electromechanical relays are the standard means for switching high frequency (e.g., >1 MHz) signals, such as T1 or DS1 (1.544 Mbit/sec) carrier signals. Two advantages electromechanical relays have over solid-state relays are the lower ON resistance (when the relay contacts are closed) and higher isolation (when the contacts are open) at high frequencies. However, electromechanical relays are large, noisy, require relatively large power to operate, and are slow to operate, compared to solid-state relays. Thus, it is desirable to provide a solid-state relay having the capability of switching high-frequency signals.

SUMMARY OF THE INVENTION

A solid-state relay having first and second terminals and responding to a control signal is characterized by: a control circuit, responsive to the control signal; a first pass transistor, connecting between the first terminal and a common node and coupling to the control circuit, the conductivity thereof being substantially determined by the control circuit; a second pass transistor, connecting between the second terminal and the common node and coupling to the control circuit, the conductivity thereof being substantially determined by the control circuit; a first shunt transistor, connecting between the common node and a reference node and coupling to the control circuit, the conductivity thereof being substantially determined by the control circuit. In addition, the pass transistors have a zero bias conductivity opposite that of the shunt transistor and the conductivity of the pass transistors changes inversely to the conductivity of the first shunt transistor in response to the control circuit.

BRIEF DESCRIPTION OF THE DRAWING

The foregoing features of this invention, as well as the invention itself, may be more fully understood from the following detailed description of the drawings, in which.

DETAILED DESCRIPTION

Figure 1:
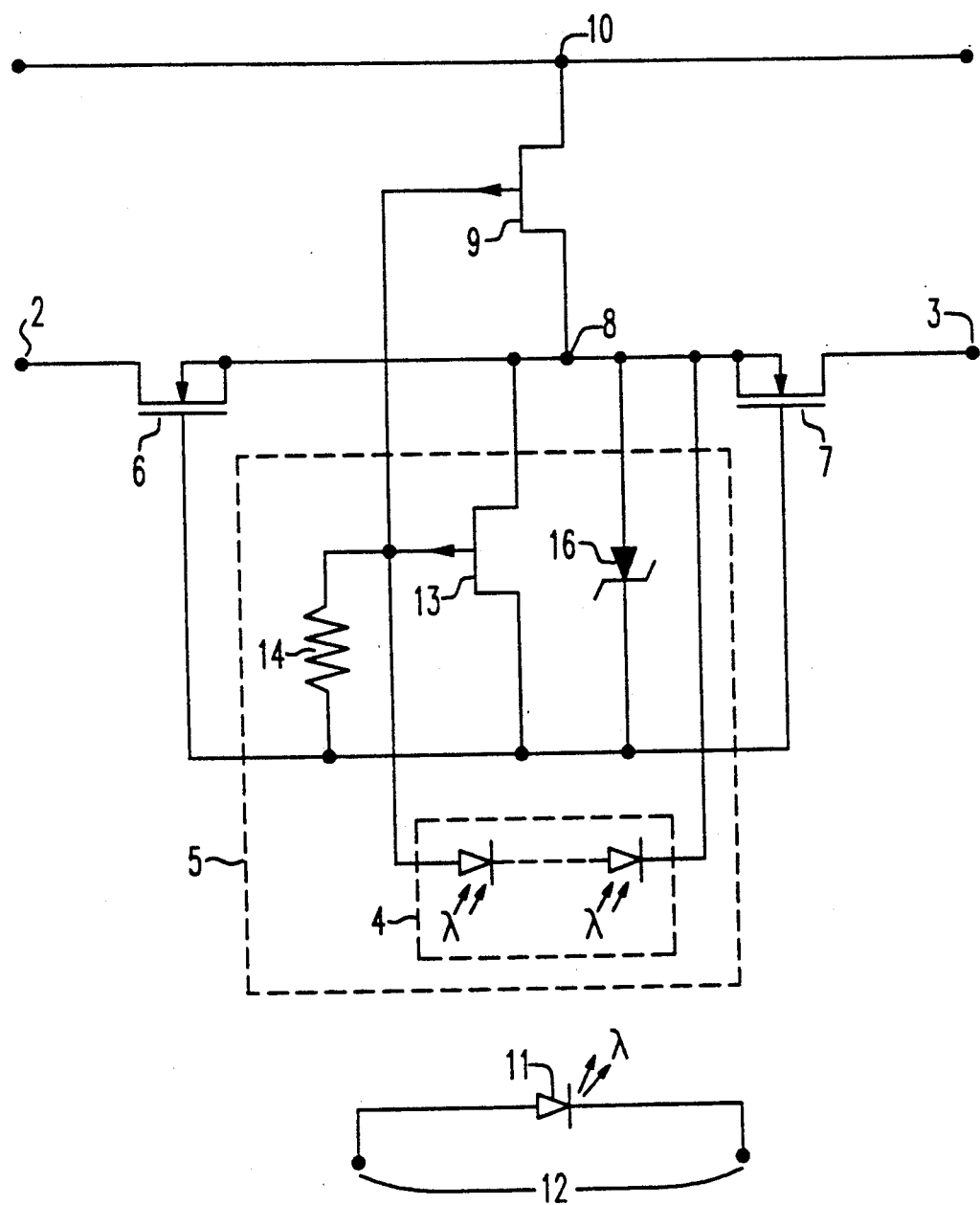
FIG. 1 is a simplified schematic drawing of one embodiment of the invention, a non-differential mode solid-state relay capable of switching high frequencies.

Referring to FIG. 1, the exemplary embodiment of the invention is described herein as a solid-state relay 1 having first and second terminals 2, 3 and responding to a control signal (optical, in this example) incident on a photodiode array 4. A control circuit 5 converts the control signal into an electrical signal to drive the gates of a first and second pass transistors 6, 7. The pass transistors 6, 7 connect between corresponding input terminals 2, 3 and a common node 8. A shunt transistor 9 is connected between the common node 8 and a reference node 10 (typically ground). The shunt transistor 9 is also controlled by the electrical signal from the control circuit 5. The pass transistors 6, 7 are metal-oxide-semiconductor field-effect transistors (MOSFETs) and the shunt transistor 9 is a junction field-effect transistor (JFET). In this example, the MOSFETs are enhancement mode transistors (the transistor is normally not conductive when a zero gate-to-source bias voltage is applied thereto) and the JFET is a depletion mode transistor (the transistor is normally conducting when a zero gate-to-source bias voltage is applied thereto). The electrical signal from the control circuit 5 controls (changes) the conductivity of the transistors 6, 7, 9 such that the change in conductivity of the pass transistors 6, 7 is the inverse of the change in conductivity of the shunt transistor 9. For example, when the pass transistors 6, 7 are conducting, the shunt transistor 9 is not conducting, and vice-versa. The shunt transistor provides a low-impedance path for signals leaking through the transistors 6, 7 when the transistors 6, 7 are not conducting, i.e., when the relay 1 is "open". When the relay 1 is "closed", the shunt transistors is not substantially conducting, while the pass transistors 6, 7 are conducting. This allows for high frequency signals to be switched with little feed-through when the relay 1 is "open".

The optical control signal is, in this example, generated by a light-emitting-diode (LED) 11 which converts an electrical control signal applied to terminals 12 into the optical control signal. An array of LEDs may be used instead of a single LED 11 as shown.

The control circuit 4 includes the photodiode array 4, junction FET 13, resistor 14, and Zener diode 16. When the optical control signal is applied to the photodiode array 4, a voltage generated by the array 4 charges the gates of transistors 6, 7, turning them on. When the optical control signal is removed, the FET 13 and resistor 14 accelerates the discharge of the gate of transistors 6, 7 to turn them off. Zener diode 16 prevents the gate-to-source voltage of the pass transistors 6, 7 from reaching such a high voltage that the transistors 6, 7 are damaged.

Figure 2:
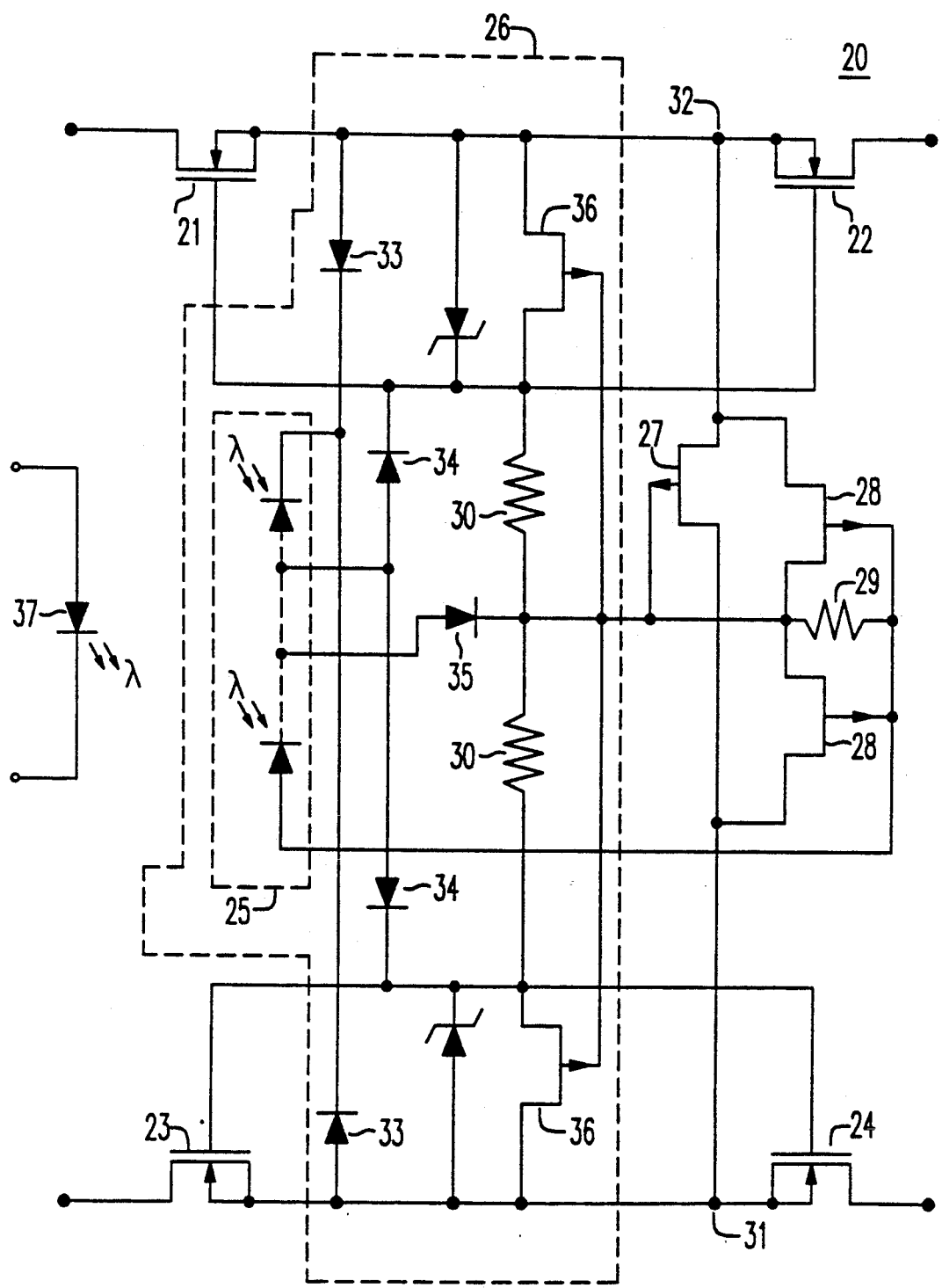
FIG. 2 is a simplified schematic drawing of another embodiment of the invention, a differential mode solid-state relay capable of switching high frequencies.

In FIG. 2, an alternative embodiment of the invention is shown. The relay 20, a differential relay, is an elaboration on the relay 1 of FIG. 1, having a control circuit 26 (including a photodiode array 25), and shunt transistor 27 coupling between common nodes 31, 32. The differential relay 20 shown has two pairs of pass transistors 21, 22 and 23, 24, each pair in series with one path (leg) through the relay. In addition to shunt transistor 27, transistors 28 and resistor 29 assist in the discharge of gate voltage on shunt transistor 27. Diodes 33 allow for the photodiode array 25 to drive both sets of pass transistors 21-24 while providing isolation between the signal paths. Diodes 34 and 35 allow for faster operation of the relay 20 by providing current from the photodiode array 25 directly to the gates of the pass transistors 21-24 and to the shunt transistor 27 without having to first pass through resistors 29, 30. The diodes 34, 35 thus guaranties that the relay 20 will break-before-make.

The components of the differential relay 20 shown in FIG. 2 has been fabricated in a common semiconductor substrate using approximately 1030×480 micron enhancement mode MOSFET pass transistors 21-24 and transistors 27, 28, and 36 are depletion mode JFETs. Shunt transistor 27 has an exemplary ON resistance of approximately 5 Ω. Resistors 30 are an exemplary 20M Ω, and resistor 29 is an exemplary 10M Ω. There are typically fifty two photodiodes in the photodiode array 25, each producing about 1 μA at 0.5 volts when illuminated by LED 37. Alternatively, an array of LEDs may be used in place of the shown single LED 37. The relay 20 has an exemplary ON resistance (differential, each leg) of 5 Ω, and an exemplary input-to-output isolation of 63 dB at 1.544 MHz across a 50 Ω load. Without the shunt transistor 27, isolation is about 28 dB.

Having described the preferred embodiment of this invention, it will now be apparent to one of skill in the art that other embodiments incorporating its concept may be used. Therefore, this invention should not be limited to the disclosed embodiment, but rather should be limited only by the spirit and scope of the appended claims.

We claim:

1. A solid-state relay having first, second, third and fourth terminals and responding to a control signal, CHARACTERIZED BY:
   a control circuit, responsive to the control signal;
   a first pass transistor, connecting between the first terminal and a first common node and coupling to the control circuit, the conductivity thereof being substantially determined by the control circuit;
   a second pass transistor, connecting between the second terminal and the first common node and coupling to the control circuit, the conductivity thereof being substantially determined by the control circuit;
   a third pass transistor, connecting between the third terminal and a second common node and coupling to the control circuit, the conductivity thereof being substantially determined by the control circuit;
   a fourth pass transistor, connecting between the fourth terminal and the second common node and coupling to the control circuit, the conductivity thereof being substantially determined by the control circuit;
   a first shunt transistor, connecting between the first and second common nodes and coupling to the control circuit, the conductivity thereof being substantially determined by the control circuit;
   wherein the conductivity of the pass transistors, in response to the control circuit, changes inversely to the conductivity of the first shunt transistor changing in response to the control circuit.

2. The solid-state relay as recited in claim 1, wherein the pass transistors are enhancement MOSFETs, the first and second pass transistors having common gates, and the third and fourth pass transistors having common gates.

3. The solid-state relay as recited in claim 2, wherein the control circuit is characterized by:
   a photodiode array coupled to the gates of the pass transistors and the first shunt transistor;
   a second shunt transistor, responsive to the photodiode array, for selectively shunting the gates of the first and second pass transistors to the first common node;
   a third shunt transistor, responsive to the photodiode array, for selectively shunting the gates of the third and fourth pass transistors to the second common node;
   wherein the control signal is an optical signal incident on the photodiode array.

4. The solid-state relay as recited in claim 3, wherein the shunt transistors are depletion mode junction FETs (JFETs).

5. The solid-state relay as recited in claim 4, wherein the transistors and diodes are formed in a common substrate.

* * * * *